United States Patent [19]

Sato et al.

[11] 4,157,557

[45] Jun. 5, 1979

[54] CONTROL CIRCUIT FOR SIGNAL TRANSMISSION

[75] Inventors: Shuichi Sato, Chofu; Makoto Hirabayashi, Kodaira; Yoshimi Hirata; Takaaki Yamada, both of Atsugi, all of Japan

[73] Assignee: Sony Corporation, Tokyo, Japan

[21] Appl. No.: 858,014

[22] Filed: Dec. 6, 1977

Related U.S. Application Data

[63] Continuation of Ser. No. 667,110, Mar. 15, 1976, abandoned, which is a continuation of Ser. No. 491,041, Jul. 23, 1974, abandoned.

[30] Foreign Application Priority Data

Jul. 23, 1973 [JP] Japan ................................ 48-82822

[51] Int. Cl.² ........................................... H01L 29/78
[52] U.S. Cl. ..................................... 357/23; 357/41; 357/59; 307/237; 307/251; 328/171; 330/145; 330/284
[58] Field of Search ........................... 357/23, 41, 59; 307/237, 251, 304; 328/171, 144; 330/284, 145

[56] References Cited

U.S. PATENT DOCUMENTS

| B 504,503 | 3/1976 | Yamada | 357/59 |
|---|---|---|---|
| 3,714,522 | 1/1973 | Kamiya et al. | 357/23 |
| 3,737,678 | 6/1973 | Dolby et al. | 307/251 |
| 3,810,035 | 5/1974 | Gundry | 330/284 |
| 3,943,286 | 3/1976 | Tsurushima | 357/23 |

OTHER PUBLICATIONS

C. Hu et al., "A Resistive-Gated IG FET Tetrode," IEEE Trans. on Elec. Dev., vol. Ed-18, #7, Jul., 1971, pp. 418-425.

Primary Examiner—Joseph E. Clawson, Jr.
Attorney, Agent, or Firm—Hill, Gross, Simpson, Van Santen, Steadman, Chiara & Simpson

[57] ABSTRACT

A control circuit for signal transmission which comprises a plurality of field effect transistors (which will be hereinafter referred to as simply FETs) with gates of high resistance is disclosed. In this case, the sources and drains of the FETs are connected commonly and connected in parallel to a signal transmission path, their gates are supplied with different voltages, and the mutual conductances among the FETs are selected to be reduced gradually.

3 Claims, 16 Drawing Figures

CONTROL CIRCUIT FOR SIGNAL TRANSMISSION

This is a continuation of application Ser. No. 667,110, filed Mar. 15, 1976 which was a continuation of Ser. No. 491,041, filed July 23, 1974, both now abandoned.

BACKGROUND OF THE INVENTION

1. Field of the Invention

The present invention relates generally to a control circuit for signal transmission, and more particularly is directed to a control circuit for signal transmission preferred for use with a sound volume adjustment circuit and so on.

2. Description of the Prior Art

In the case where a prior art control circuit for signal transmission is employed in, for example, a sound volume adjusting circuit, since the control circuit uses generally a variable impedance element such as a bipolar transistor, an FET or the like, its control for signal transmission in amount must be carried out with a small amount of signal amplification and, in addition thereto, there is proposed a problem of distortion factor in view of the current-voltage characteristics of the element. As a result, it may become difficult that the dynamic range for the signal control can not be made wide. In general, it is desired that the dynamic range of an input signal is wide, the gain is linear for a control voltage and that the distortion factor is low for both an audio signal and a video signal.

However, since the variable impedance element has a saturation region for its voltage-current characteristics as well known, it is impossible to make its dynamic range wide and produce an output signal with a low distortion factor.

SUMMARY OF THE INVENTION

According to the present invention there is provided a control circuit for signal transmission comprising a plurality of field effect transistors with gates of high resistance, in which the sources and drains of the FETs are connected commonly and connected in parallel to a signal transmission path, their gates are supplied with different voltages, and the mutual conductances among the FETs are selected to be reduced gradually.

It is an object of the present invention to provide a control circuit for signal transmission free from the drawback encountered in the prior art.

It is another object of the invention to provide a control circuit for signal transmission preferable for used with a volume control circuit.

It is a further object of the invention to provide a control circuit for signal transmission which achieves gain control easily.

It is a further object of the invention to provide a control circuit for signal transmission which employs a plurality of FETs with good linearity to achieve gain control positively.

It is a further object of the invention to provide a control circuit which is easily made as an integrated circuit.

The other objects, features and advantages of the present invention will be apparent from the following description taken in conjunction with the accompanying drawing in which the same reference numerals or symbols indicate the same elements.

DESCRIPTION OF THE PREFERRED EMBODIMENTS

First of all, an FET which may preferred for use with the present invention will be described now. The FET has a gate layer with high resistance, which will be described later, so that the FET will be refereed to as an SRG in the following description.

Figure 1:
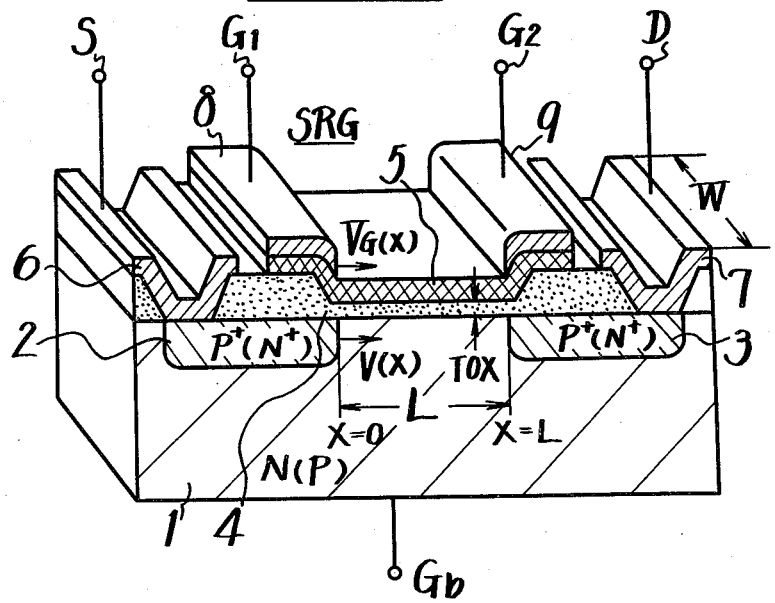
FIG. 1 is a perspective view of an FET used in the control circuit for signal transmission according to the present invention as a variable impedance element.

FIG. 1 shows generally the SRG used as a variable impedance element in the present invention. In FIG. 1, reference numeral 1 indicates a semiconductor substrate of an N-type (or P-type) conductivity. A source region 2 and a drain region 3 of a P+-type (or N+-type) conductivity are formed on the upper surface of the substrate 1 with a predetermined distance L therebetween, and an insulating layer 4 is formed on the upper surface of the substrate 1 between regions 2 and 3. A resistive layer (gate resistive layer) 5 with high resistance is formed on the insulating layer 4. A source electrode 6 and a drain electrode 7 are formed on the regions 2 and 3, respectively, and a first gate electrode 8 and a second gate electrode 9 are formed on end portions of the resistive layer 5 adjacent to the electrodes 6 and 7, respectively. A source terminal S, a drain terminal D, a first gate terminal $G_1$, a second gate terminal $G_2$ and a back gate terminal $G_b$ are led out from the electrodes 6, 7, 8 and 9 and the substrate 1, respectively.

By way of example, in such a case that the substrate 1 is made relatively low in impurity concentration and especially in the case that another substrate with the different conductivity type to that of the substrate 1 is provided under the latter to form an integrated circuit, in order to avoid an influence of the second substrate to the substrate 1, the substrate 1 is selected in impurity concentration to have a resistivity of about 50Ω cm, and the regions 2 and 3 are selected to be of $10^{20}$ atoms $cm^{-3}$ in impurity concentration. Further, the length or the channel length L between the regions 2 and 3 is selected 20μ (microns), its width W is about 300μ and the thickness $T_{ox}$ of the insulating layer 4 is about 1200 A (angstroms) for silicondioxide $SiO_2$. The resistive layer 5 is made of polycrystalline silicon and selected of about 1μ in thickness. In this case, if the resistive layer 5 is too high in resistance value, the ohmic contact with the electrodes 8 and 9 is deteriorated, while too low in resistance value, a signal may leak. Accordingly, the resistive layer 5 is made to have a sheet resistance value of $10K\Omega/\square$ to $1G\Omega/\square$.

With the FET or SRG shown in FIG. 1, if it is assumed that a voltage at a point x in the channel apart by an arbitrary length from the region 2 is taken as $V(x)$; a gate voltage in the resistive layer 5 at the point x as $V_G(x)$; a gate threshold voltage as $V_{th}$; the condition $V_G(x) - V(x) > V_{th}$ is satisfied; and the modulation of $V_{th}$ by the substrate voltage is very small, a number N of carriers per unit area in the channel at the point x is expressed as follows:

$$N = \frac{C_o}{q} \{V_G(x) - V(x) - V_{th}\}[cm^{-2}]$$

where $C_o = \epsilon_{ox}/T_{ox}$, $\epsilon_{ox}$ represents the dielectric constant of the insulating layer 4 and of the electric charge of the carrier.

Further, on the assumption that the resistance value of the channel from the region 2 to the point x is taken as $R(x)$, the resistance value per square of the channel or its sheet resistance as $\rho_S(x)$ and the mobility of the carrier as p, the following relationships are established:

$$dR(x) = \rho_S(x) \frac{dx}{W}$$

$$\rho_S(x) = \frac{1}{Nq\mu}$$

Accordingly, the following expression is obtained:

$$dR(x) = \frac{1}{C_o\mu\{V_G(x) - V(x) - V_{th}\}} \cdot \frac{dx}{W}$$

Thus, if the channel current is taken as I, the following expression is obtained:

$$IdR(x) = dV(x) = \frac{I}{W\mu C_o\{V_G(x) - V(x) - V_{th}\}} dx$$

and hence the following equation (1) is obtained.

$$\{V_G(x) - V(x) - V_{th}\} dV(x) = \frac{I}{W\mu C_o} dx \quad (1)$$

If the following equation (2) is established $$V_G(x) - V(x) = V_{GO} = \text{constant} \quad (2)$$

(the necessary and satisfactory conditions for establishing the equation (2) are $$V_G(x) = V_{GO} + \frac{x}{L} V,$$

but its proof is omitted), the equation (2) is substituted into the equation (1), and then the equation (1) is integrated from x=0 to x=L, the following equation (3) is obtained:

$$I = \beta(V_{GO} - V_{th})V \quad (3)$$
$$(\because V(L) = V)$$
$$\text{where } \beta = \frac{W\mu C_o}{L} \quad (3')$$

If the source voltage is taken as $V_S$ and the drain voltage as $V_D$, $V = V_D - V_S$. Further, if the resistive layer 5 is uniform in its material and thickness, $$V_G(x) = \frac{x}{L} V.$$

Thus, if the voltage of the first gate is selected $V_S + V_{GO}$ and the voltage of the second gate is selected $V_D + V_{GO}$, the above mentioned necessary and satisfactory conditions are established, and consequently the equation (2) is satisfied to establish the equation (3) or $I = \beta(V_{GO} - V_{th})V$.

Figure 2:
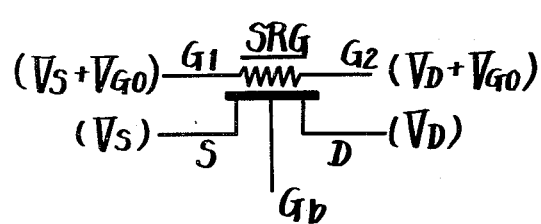
FIG. 2 is its symbolized view.

As a result, a linear resistor is obtained between the source and the drain regions and its resistance value can be controlled variable by the voltage $V_{GO}$. In other words, if the voltages of the source, drain, first gate and second gate are taken as $V_S$, $V_D$, $V_S + V_{GO}$ and $V_D + V_{GO}$, respectively, a linear resistor is formed between the source and drain and its resistance value is controlled variable by the voltage $V_{GO}$. The above described SRG is symbolized as shown in FIG. 2.

Figure 3:
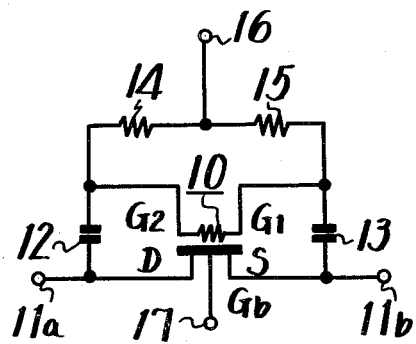
FIG. 3 is a connection diagram showing one method of using the FET.

FIG. 3 shows a fundamental connection diagram in which the SRG is employed as a variable impedance element. In this example, between terminals 11a and 11b an SRG 10 is connected with its drain and source D and S being connected to the terminals 11a and 11b, respectively. A capacitor 12 is connected in parallel between the drain D and second gate $G_2$ of the SRG 10 and a capacitor 13 is connected in parallel between the source S and first gate $G_1$. A series circuit of resistors 14 and 15 is connected in parallel between the second and first gate $G_2$ and $G_1$ of the SRG 10, and a control terminal 16 is connected to the connection point between the resistors 14 and 15. In this case, the back gate $G_b$ of the SRG 10 is connected to a terminal 17 which is used to apply a back gate voltage (a reverse bias voltage) $V_{BO}$ to the substrate 1, if necessary. If it is assumed that a frequency of a signal control by the SRG 10 or a signal to be controlled is taken as $f_1$; the frequency of the control voltage $V_{GO}$ as $f_2$; the resistance value between the second and first gates of the SRG 10 as R; and the capacity values of the capacitors 12 and 13 and the resistance values of the resistors 14 and 15 as $C_1$, $C_2$ and $R_1$, $R_2$, respectively; the conditions $f_1 >> f_2$; $C_1R_1 = C_2R_2$; R, $R_1$ and $R_2 >> 1/(2\pi f_1 C_1)$; and $R >> 1/(2\pi f_1 C_1)$ are satisfied, respectively.

Accordingly, in this case the source and drain of the SRG 10 are made to have voltages $V_S$ and $V_D$ by the signal to be controlled. While, the reactances of the capacitors 12 and 13 are low viewed from the signal to be controlled, but high viewed from the control voltage $V_{GO}$, so that the voltages of the first and second gates becomes to $V_S + V_{GO}$ and $V_D + V_{GO}$. As a result, an impedance with good linearity is obtained between the terminals 11a and 11b and also its value can be controlled variable by the control voltage $V_{GO}$ at the terminal 17.

Figure 4:
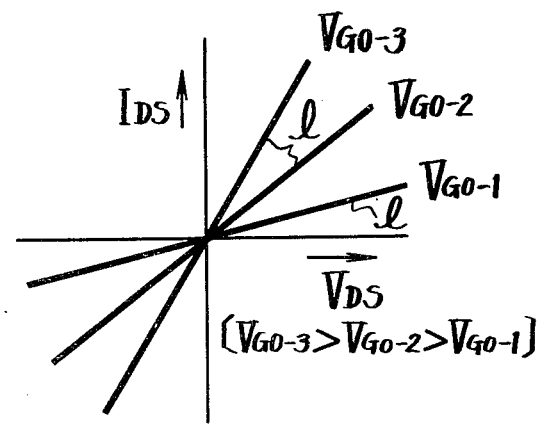
FIGS. 4 and 5 are graphs showing its characteristics.

FIG. 4 shows a graph of characteristic curves showing the above relationship in which the abscissa represents the voltage $V_{DS}$ between the drain and source and the ordinate the current $I_{DS}$ therebetween. As may be apparent from the graph of FIG. 4, the impedance changes linearly and the gradient or inclination of a curve 1 is changed by increasing the control voltage $V_{GO}$ and hence the impedance is controlled variable by the control voltage $V_{GO}$.

Figure 5:
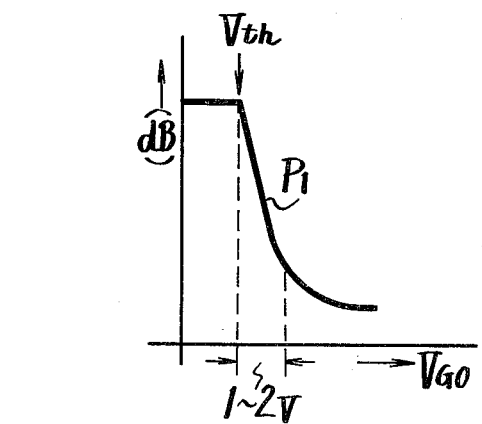

The gain characteristic of the above variable impedance element is shown in the graph of FIG. 5 by a curve P₁. Accordingly, although the linearity is good, the variable range of the control voltage for a single SRG is narrow or about 1 to 2 volts in the graph of FIG. 5, so that it is difficult to control the gain correctly.

An embodiment of the control circuit for signal transmission according to the present invention, in which a plurality of the SRGs with gain characteristics of good linearity are employed to achieve a gain control easily and made as an integrated circuit, will be now described with reference to FIG. 6.

In the present invention, a plurality of SRGs are connected in parallel to a signal transmission path or line, the drains and sources of the SRGs are connected commonly, respectively, and the gates of the SRGs are supplied with different gate voltages. In the embodiment of FIG. 6, for conveniences sake two SRGs or SRG-1 and SRG-2 are used. As may be obvious from FIG. 6, two SRGs or SRG-1 and SRG-2 are connected in parallel to a signal transmission line $l_1$ for a signal S to be transmitted. That is, drains $D_1$ and $D_2$ of the SRG-1 and SRG-2 are connected common through the transmission line $l_1$ and their sources $S_1$ and $S_2$ are both grounded. First gates $G_1$ of the SRG-1 and SRG-2 are connected to the transmission line $l_1$ through coupling capacitors 20 and 21, respectively, and their second gates $G_2$ are supplied with different gate voltages $V_{GO1}$ and $V_{GO2}$ through terminals 22 and 23, respectively.

As already described in connection with FIG. 1, in the case that the threshold voltage $V_{th}$ of the SRG is lower than the control voltage $V_{GO}$, the equation (3) is satisfied to form a linear resistor between the source and drain. In such a case, the channel resistance $R_C$ in the SRG (a n-channel type) between its source and drain is expressed by the following equation (4) from the equation (3):

$$R_C = \frac{V}{I} = \frac{1}{\beta(V_{GO} - V_{th})} \quad (4)$$

Accordingly, in the case that the SRG-1 and SRG-2 (two SRGs) are used, if the gate voltages $V_{GO1}$ and $V_{GO2}$ applied to the respective SRG-1 and SRG-2 satisfy the conditions $V_{th} < V_{GO1}$ and $V_{th} < V_{GO2}$, their channel resistances $R_{C1}$ and $R_{C2}$ between their sources and drains can be expressed as follows:

$$R_{C1} = \frac{1}{\beta_1(V_{GO1} - V_{th})}$$

$$R_{C2} = \frac{1}{\beta_2(V_{GO2} - V_{th})}$$

where $\beta_1$ and $\beta_2$ are proportional constants with dimension similar to $\beta$ of the equation (3′) in the SRG-1 and SRG-2.

Figure 6:
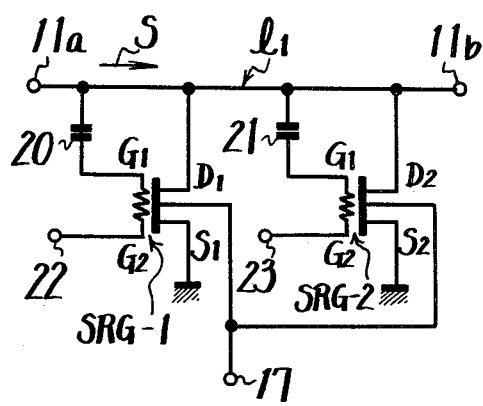
FIG. 6 is a connection diagram showing a fundamental embodiment of the control circuit for signal transmission of the invention.

If the channel resistance (composite resistance) $R_{CT}$ between the source and drain of the SRG-1 and SRG connected in parallel as shown in FIG. 6 satisfies the condition of $V_{GO1} > V_{GO2} > V_{th}$, it is expressed as follows:

$$R_{CT} = \frac{1}{\beta_1(V_{GO1} - V_{th}) + \beta_2(V_{GO2} - V_{th})} \quad (5)$$

In this case, if $V_C$ is constant and $V_{GO2} = V_{GO1} - V_C$ is satisfied, the channel resistance $R_{CT}$ in the condition of $V_{th} < V_{GO2}$ is expressed as follows from the equation (5):

$$R_{CT} = \frac{1}{(\beta_1 + \beta_2)V_{GO1} - (\beta_1 V_{th} + \beta_2 V_{th} + \beta_2 V_C)} \quad (6)$$

Accordingly, the channel resistance $R_{CT}$ becomes linear all over $V_{th} < V_{GO1}$ as in the case of the equation (3). That is, even in the case where two SRGs or SRG-1 and SRG-2 are connected as shown in FIG. 6, a resistor with a linear resistance is obtained between the source and drain, and consequently the SRG-1 and SRG-2 act as a variable impedance element with good linearity as a whole. In FIG. 6, the terminal 17 is connected in common to the back electrodes of the SRG-1 and SRG-2.

Figure 7:
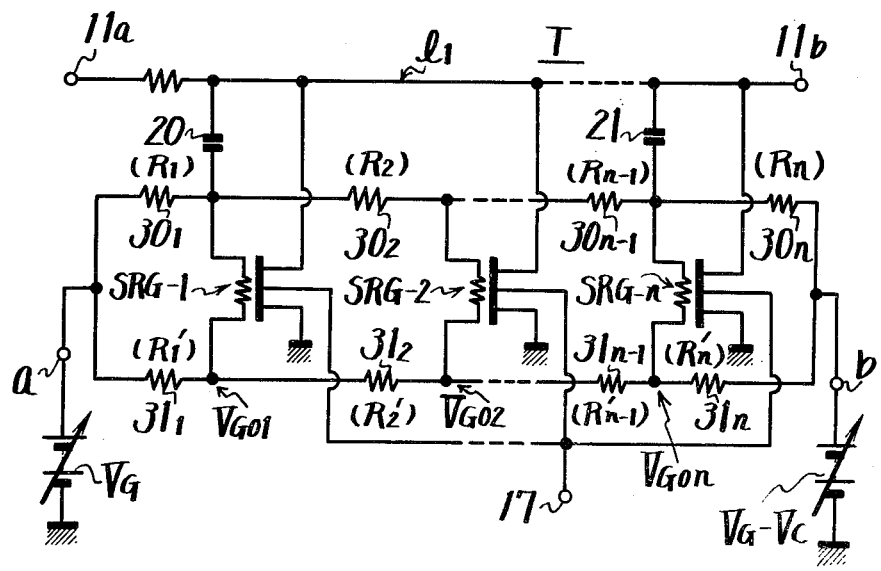
FIG. 7 is a connection diagram showing a practical embodiment of the control circuit for signal transmission of the invention.

FIG. 7 shows a further embodiment of the control circuit for signal transmission T of the invention in which a plurality of the SRGs or SRG-1, SRG-2, . . . SRG-n are used and which is used as an attenuator circuit such as a sound volume adjusting circuit or the like. In the embodiment of FIG. 7, a terminal a is supplied with control voltage $V_G$, while, a terminal b is supplied with the control voltage $V_G - V_C$, respectively. The gates of the SRG-1 to SRG-n are supplied with the control voltages $V_G$ and $V_G - V_C$ through voltage dividing resistors $30_1$ to $30_n$ and those $31_1$ to $31_n$ to be supplied with desired gate voltages, respectively. It is desired that resistance values $R_1$ to $R_n$ and $R'_1$ to $R'_n$ of the resistors $30_1$ to $30_n$ and $31_1$ to $31_n$ are somewhat unified and must be sufficiently lower than the resistance values of the respective SRG-1 to SRG-n between their first and second gates. However, the resistance values can not be selected so low from the view point of power consumption and so on. As a result, if the resistance values between the first and second gates of the SRGs are selected, for example, several hundreds of MΩ, those of the resistors $30_1$ to $30_n$ and $31_1$ to $31_n$ are selected, for example, several hundreds of KΩ. In the illustrated example of FIG. 7, all the resistors $30_1$ to $30_n$ and $31_1$ to $31_n$ are selected equal in resistance value, so that if the SRG is formed in an n-channel type, the control voltage $V_G$ is applied to the SRGs as a positive voltage as shown in FIG. 7. Thus, the relationship among the gate voltages of the SRGs becomes to $V_{GO1} > V_{GO2} \ldots > V_{GOn} > V_{th}$ and the voltage difference between the adjacent gate voltages becomes to $V_{GO1} - V_{GO2} = V_{GO2} - V_{GO3} \ldots V_{GOn-1} - V_{GOn} = V_C$.

By applying the different gate voltages $V_{GO1}$ to $V_{GOn}$ to the gates of the SRG-1 to SRG-n, and making their threshold voltages $V_{th}$ equal, as the control voltage $V_G$ applied to the terminal a is varied to be increased gradually, the SRG-1 to SRG-n are successively made ON in this order. In this case, since the difference between the gate voltages of the adjacent SRG-1 to SRG-n is constant, the SRG-1 to SRG-n is successively made ON at every 2V, if the $V_C$ is 2 V.

In order to improve the total gain characteristics of the control circuit T by differing the gain characteristics of the SRG-1 to SRG-n, mutual conductances Gm of the SRG-1 to SRG-n are made high gradually as they arrive at the post stage. Since the mutual conductance gm is expressed by $gm = \beta V_G$, the mutual conductance gm is in proportion to the shape of the element or W/L (where W represents the channel width of the element and L the channel length thereof, as mentioned above). Thus, the SRG-1 to SRG-n with different mutual conductances gm can be formed by making their, for example, channel width W different.

Figure 8:
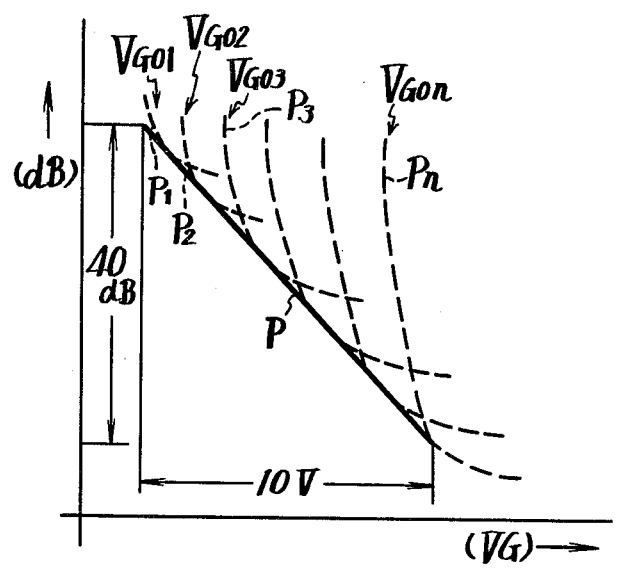
FIG. 8 is a graph showing its characteristics used for the explanation thereof.

The gain characteristics of the respective SRGs in the control circuit T can be shown in the graph of FIG. 8. Since the gate voltages $V_{GO1}$ to $V_{GOn}$ of the respective SRG-1 to SRG-n are selected different as mentioned above, their gain characteristics become different as shown in FIG. 8 by curves $P_1$ to $P_n$. That is, the curve $P_1$ represents the gain characteristic of the SRG-1, the curve $P_2$ that of the SRG-2, ... and the curve $P_n$ that of the SRG-n, respectively. As a result, the total gain characteristics become to that shown by a solid line curve P, so that it may be obvious from the description of the equation (6) that its linearity becomes superior.

Further, according to experiments carried by the inventors of the present invention, it is ascertained that the variable range of the control voltage $V_G$ is expanded to about 10V by the employment of three SRGs and at this time the gain control thereof reaches about 40dB.

In order to make the linearity of the curve P good as shown in FIG. 8, in place of that the mutual conductances gm and the gate voltages $V_{GO1}$ to $V_{GOn}$ of the SRG-1 to SRG-n are selected different as described above, it may be sufficient that the source voltages $V_S$ of the SRG-1 to SRG-n are selected different because their threshold voltage $V_{th}$ can be changed by selecting their source voltage $V_S$ with their gate voltages $V_{GO1}$ to $V_{GOn}$ being constant.

However, if the curve P shown in FIG. 8 is obtained by the method mentioned just above, it is required that capacitors with relatively large capacities are connected between the source and drain of the SRG-1 to SRG-n to connect the source and drain in view point of AC but cut off them in view point of DC. Accordingly, it may become difficult such a circuit construction is made as an integrated circuit.

With the circuit construction of the present invention, since the drains of the SRGs are connected in common and their sources are grounded, no capacitors are required between the sources and drains. Thus, the circuits of the invention can be easily made as an integrated circuit.

Figure 9A:
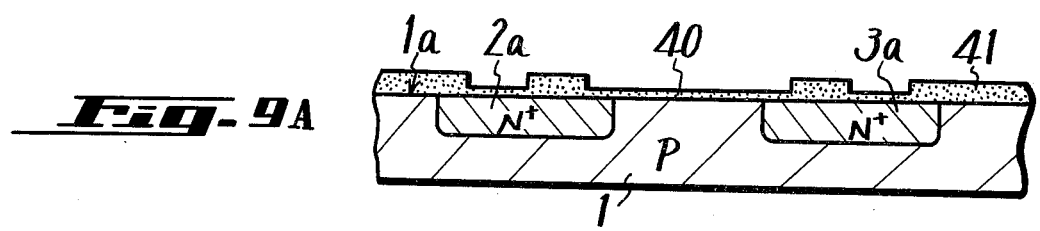
FIGS. 9A to 9E, inclusive, are cross-sectional views showing an example of the method for manufacturing the control circuit of the invention.
Figure 9B:
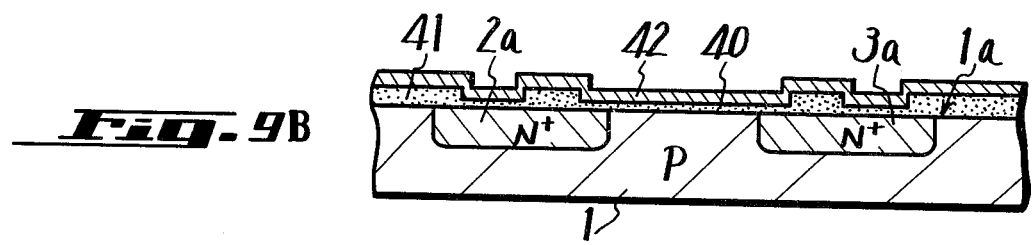
Figure 9C:
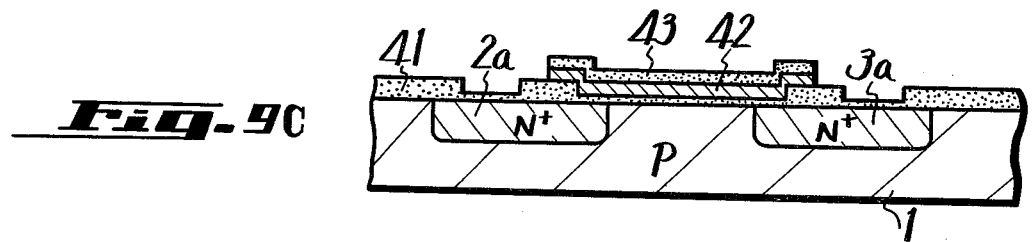
Figure 9D:
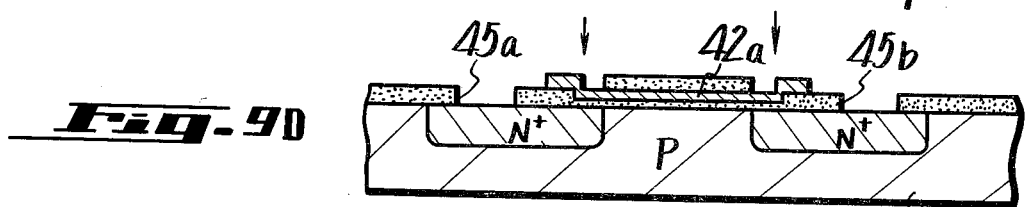
Figure 9E:
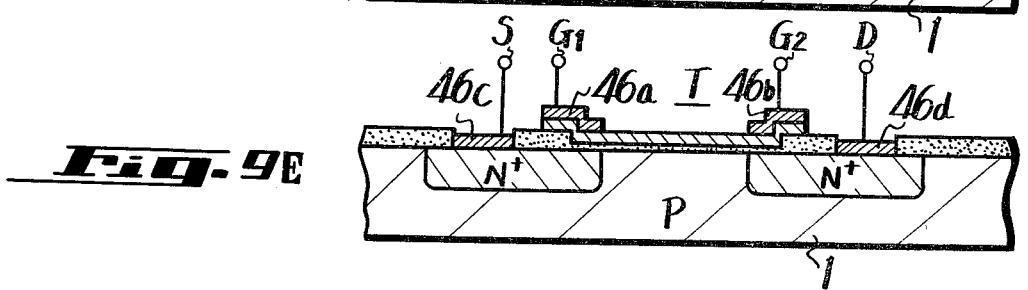
Figure 10:
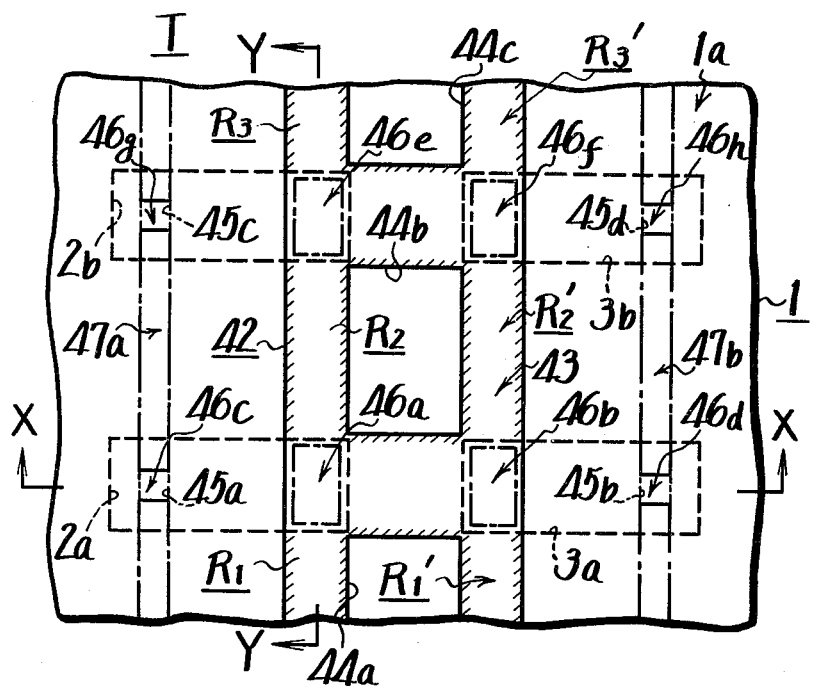
FIG. 10 is a schematic diagram showing the plain of the control circuit according to the invention.

With reference to FIGS. 9 to 11, an example of the method for making the control circuit T shown in FIG. 7 will be now described. In this example, the resistors $30_1$ to $30_n$ and $31_1$ to $31_n$ are formed together with the formation of the resistive layer 5, which will be described later.

At first, an impurity of N-type conductivity such as a boron or the like is diffused into the P-type semiconductor substrate 1 to form a source region 2a and a drain region 3a, respectively, and also a gate insulating layer 40 with a predetermined thickness made of silicon dioxide $SiO_2$ is formed on an upper surface 1a of the substrate 1 over the area opposing the channel between the regions 2a and 3a (refer to FIG. 9A). Since the construction shown in FIG. 9A is similar to that of a well known MOS FET, its detailed description will be omitted but in the figure reference numeral 41 designates an insulating layer made of $SiO_2$ or the like which is used as a mask upon the diffusion of the impurity. Other regions 2b and 3b and so on similar to those 2a and 3a in construction are formed in the substrate 1 in the direction perpendicular to the plane of the sheet of FIG. 9A as shown in FIG. 10 which is a plan view of the substrate 1. That is, as shown in FIG. 10, the source regions 2a, 2b and so on, and the drain regions 3a, 3b and so on are formed on the substrate 1 in parallel in the same direction. Thus, it is said that FIG. 9A is a cross-sectional view taken on the line X—X in FIG. 10.

Figure 11A:
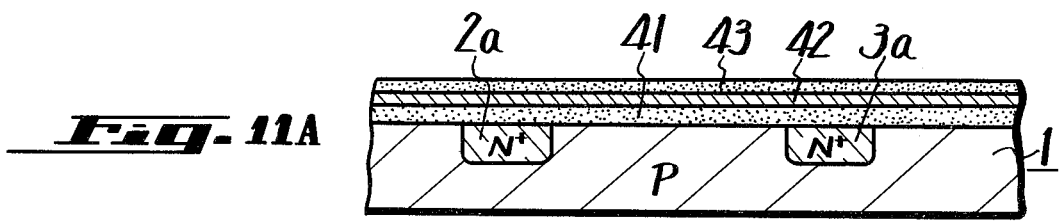
FIGS. 11A and 11B are cross-sectional views of FIG. 10 taken along the lines Y—Y thereof used for explaining the manufacturing steps the control circuit shown in FIG. 10.
Figure 11B:
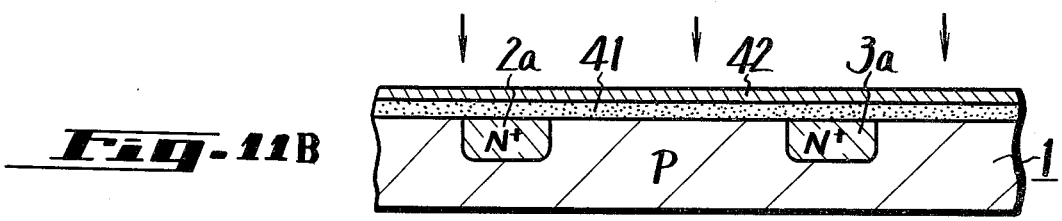

After the gate insulating layer 40 is formed, a resistive layer 42 with high resistance made of poly-silicon or the like is formed on the upper surface 1a of the substrate 1 all over it (refer to FIG. 9B). Thereafter, in order to make the resistive layer 42 with a predetermined pattern, an insulating layer 43 made of $SiO_2$ or the like is coated on the resistive layer 42. Then, the resistive layer 42 is etched with the insulating layer 43 as a mask to be formed with the predetermined pattern (refer to FIG. 9C). Thus formed resistive layer 42 with the predetermined pattern together with the gate layer 5 with high resistance, which is formed in opposed relation to the channel as described with reference to FIG. 1, serve as the resistors $30_1$ to $30_n$ and $31_1$ to $31_n$ shown in FIG. 7. Thus, the pattern obtained by the process shown in FIG. 9C becomes to that shown in FIG. 10. As shown in FIG. 10, in order to make that the resistive layer 42 with high resistance is located on the upper surface 1a of the substrate 1 opposing the channels of a plurality of SRGs and also on the portions covering a plurality of source regions 2a, 2b... and a plurality of drain regions 3a, 3b, ... so as to form the resistors $30_1$ to $31_n$, the insulating layer 43 is etched to be a pattern which has grooves 44a, 44b... As a result, the resistive layer 42 is made similar to the insulating layer 43 in pattern. The cross-sectional view of FIG. 10 on the line Y—Y after the process of FIG. 9C is finished is shown in FIG. 11A.

In general, the sheet resistance of the resistive layer 42 is in the order of $10^{10}$ to $10^{11} \Omega/\square$ but, in the case of the SRGs used in this example, the resistance value of a resistive layer 42a (which will be hereinafter referred to as a gate resistive layer) opposing to the channel is made to be several hundreds $M\Omega$ by selecting the width and thickness of the resistive layer. Since the resistors $30_1$ to $31_n$ are selected to have a resistance value of about $500 K\Omega$, such a process to diffuse an impurity into the resistive layer 42 except the gate resistive layer 42a is next achieved for decreasing its sheet resistance. That is, insulating layer 43 is subjected to, for example, a photoetching process to etch out the same except that coated on the upper surface of the gate resistive layer 42a (refer to FIG. 9D and FIG. 11B) and thereafter an impurity such as boron or the like is diffused into the resistive layer 42 at a desired amount. The sheet resistance of the resistive layer 42 depends upon its width, thickness and so on, but, by way of example, the impurity is diffused into the resistive layer 42 to make that it has the sheet resistance of $10^5$ to $10^6 \Omega/\square$. During the photoetching process, the above mentioned diffusion is carried out and also an etching process forming windows 45a, 45b, ... for electrodes, which will be described later, is carried out. An electro conductive layer made of such as aluminium is coated on the elements including the windows 45a, 45b, ... and the electro conductive layer is etched suitably through a mask to form electrodes 46a, 46b, ... (refer to FIG. 9E). In order to make that the source electrodes 46c, 46g, ... and the drain electrodes 46d, 46h (refer to FIG. 10) are connected commonly as shown in FIG. 7, the source electrodes and drain electrodes are electrically connected by band-shaped conductive layers 47a and 47b, respectively, as shown in FIG. 10.

Thus, on the substrate 1 there are formed the gate resistive layer 42a and the resistors $30_1$ to $31_n$ with desired resistance values at the same time and hence the control circuit T is formed as an integrated circuit. In this case, the coupling capacitors 20 and 21 are attached thereto from the outside.

As described above, in the present invention a plurality of SRGs are connected to the signal transmission path or line l₁ in parallel with one another and different gate voltages are applied to their gates. With such a construction of the present invention, the linear range of the total gain characteristics is expanded and the variable range of the control voltage $V_G$ can be also made wide, so that the gain control can be performed very correctly. As a result, the control circuit of the present invention is preferred as an attenuator circuit in a sound volume adjusting circuit and also as a gain control circuit in a television receiver, a video tape recorder, a cassette tape recorder or the like.

Further, since in the present invention the source and drain electrodes of the plurality of SRGs are connected common, respectively, it is no need to use the capacitor in order to make that the source and drain electrodes of the SRGs are grounded from the view point of AC but cut off from the view point of DC. For this reason, the control circuit T can be easily made as an integrated circuit. With a circuit which can not dispence with a capacitor, it requires trouble working to connect the capacitor externally and the capacitor becomes to an obstacle for making the circuit compact. With the present invention, however, such defects can be eliminated.

Further, in the present invention if, in view of the voltages $V_{GO1}$ to $V_{GOn}$ applied to the gates of the SRG-1 to SRG-n, the resistance value of the resistors $30_1$ to $31_n$ is selected equal to satisfy $V_{GO1} - V_{GO2} = V_{GO2} - V_{GO3} = \ldots = V_C$, the voltage difference which may make the SRGs ON becomes constant ($V_C$). Therefore, if the difference between the mutual conductances of the SRGs is made constant, the gradient or inclination from the characteristic curves $P_1$ to $P_n$ becomes constant to obtain the gain characteristic curve with good linearity.

In the case where the control circuit T is made as an integrated circuit, if, upon the formation of the gate resistive layer 42a with high resistance as in the case of the illustrated embodiment, the resistive layer 42 with high resistance and made of poly-silicon, which is used for making up the resistive layer 42a, is used as the resistors $30_1$ to $31_n$, a plurality of desired resistors $30_1$ to $31_n$ can be formed by diffusing the impurity into the resistive layer 42 with high resistance and hence the process for making the circuit can be simplified. In the case where the resistors with the desired resistance value are obtained by diffusing the impurity into the resistive layer 42, if the configuration of the resistive layer 42 with high resistance, which is etched, is made constant, the ratio of the resistance values of the resistors connected to the first and second gates of the SRGs (that is, $R_1/R'_1 = R_2/R'_2 = \ldots = R_n/R'_n$) is held constant. Thus, the voltage difference between the gates of the SRGs-1 to SRG-n is not changed, which will mean that the gain characteristics with good linearity mentioned as above can be presented positively.

It will be apparent that many changes and modifications could be effected by those skilled in the art without departing from the spirits and scope of the novel concepts of the present invention.

We claim as our invention

1. A control circuit adapted for attenuating a signal transmission comprising:
 a signal transmission path;
 a pair of field effect transistors each having a main current portion with source and drain electrodes connected between said signal transmission path and ground, and each having an insulated resistive gate with a pair of gate electrodes mounted on said gate respectively over said main current portion for controlling a current therethrough, each of said field effect transistors having a different mutual conductance;
 a pair of bias control means respectively connected to one of said pair of gate electrodes of each of said field effect transistors for applying a different bias control voltage to each of said pair of gate electrodes;
 a first capacitor connected between said signal transmission path and the other one of said pair of gate electrodes of one of said pair of field effect transistors, and a second capacitor connected between said signal transmission path and the other one of said pair of gate electrodes of said second one of said pair of field effect transistors; whereby said differing bias control voltages and the differing mutual conductances permit the pair of field effect transistors to provide a combined linear attenuation characteristic.

2. A control circuit adapted for attenuating a signal comprising:
 a signal transmission path;
 a plurality of insulated resistive gate field effect transistors each having a channel portion with a source and a drain and each having an insulated resistive gate portion for controlling current through said channel portion, each of said field effect transistors sources and drains being connected between said signal transmission path and ground, each of said field effect transistors having a pair of gate electrodes mounted on opposite ends of said resistive gate portion;
 a plurality of capacitors connected, respectively, between one of said pair of gate electrodes of each of said field effect transistors and said signal transmission path, and
 a plurality of resistors each connected in series and respectively connected between the other ones of said pair of gate electrodes, a bias source connected across said plurality of resistors for applying a control voltage to each gate which differs and increases by a substantially constant amount for each gate.

3. A control circuit comprising:
 a signal transmission path;
 a plurality of FET's each having a source, a drain, a channel portion, an insulated resistive gate overlying said channel portion and two gate electrodes mounted on said gate and overlying said source and drain and at least AC coupled to said source and drain and means for providing a voltage between said gate and said channel portion substantially equal throughout the channel portion at any drain-source voltage;
 each of said FET's having a different transconductance and being connected parallel to said signal transmission path at said source and drain; and
 means for applying a different control voltage to each of the gates of said FET's, whereby said differing control voltages and transconductances permit the plurality of FET's to provide a combined characteristic of substantially linear attenuation.

* * * * *